United States Patent [19]

Eklund

[11] Patent Number: 5,049,513
[45] Date of Patent: Sep. 17, 1991

[54] BI CMOS/SOI PROCESS FLOW

[75] Inventor: Robert H. Eklund, Plano, Tex.

[73] Assignee: Texas Instruments Incorporated, Dallas, Tex.

[21] Appl. No.: 583,418

[22] Filed: Sep. 17, 1990

[51] Int. Cl.⁵ .................................... H01L 21/265
[52] U.S. Cl. ............................ 437/34; 437/57;
437/31; 437/56; 148/DIG. 9; 148/DIG. 150
[58] Field of Search ................ 437/34, 55, 65, 33,
437/84, 59; 148/DIG. 9, DIG. 50; 357/43, 23.7

[56] References Cited

U.S. PATENT DOCUMENTS

| 3,936,929 | 2/1976 | Bean et al. ........................ 437/59 |
| 4,050,965 | 9/1977 | Igri et al. ........................ 437/65 |
| 4,751,561 | 6/1988 | Jastrzebski ....................... 357/43 |
| 4,753,896 | 6/1988 | Matloubian ..................... 357/23.7 |
| 4,810,667 | 3/1989 | Zorinsky et al. ................. 437/33 |
| 4,863,878 | 9/1989 | Hite et al. . |
| 4,897,703 | 1/1990 | Spratt et al. . |
| 4,899,202 | 2/1990 | Blake et al. . |
| 4,906,587 | 3/1990 | Blake . |

FOREIGN PATENT DOCUMENTS 0049464  2/1990  Japan .................................... 437/84

OTHER PUBLICATIONS

Thin Film Silicon: Preparation, Properties, and Device Applications, Allison et al.; IEEE, vol. 57, No. 9; 9/69; pp. 1490-1498.

Primary Examiner—Brian E. Hearn
Assistant Examiner—Michael Trinh
Attorney, Agent, or Firm—Melvin Sharp; James T. Comfort; N. Rhys Merrett

[57] ABSTRACT

The invention provides a bipolar transistor structure on a buried oxide layer for use in an integrated circuit and a method for fabricating the same. The invention may be incorporated into a method for fabricating bipolar transistors in a BiCMOS structure. The bipolar transistor is constructed in two stacked epitaxial layers. The first epitaxial layer is used to form both the MOSFET and the buried collector of the bipolar transistor. The second epitaxial layer is grown as a blanket epitaxial layer. The intrinsic collector and the base of the bipolar transistor are formed in the second epitaxial layer. An oxide layer is formed over the base. The emitter is formed of a polysilicon layer which is deposited through an opening in the oxide layer such that the polysilicon layer contacts the second epitaxial layer.

7 Claims, 5 Drawing Sheets

BI CMOS/SOI PROCESS FLOW

This invention was made with Government support under contract No. SC-0010-87-0021 awarded by Naval Weapons Support Center. The Government has certain rights in this invention.

RELATED APPLICATIONS

"SOI BiCMOS Process", by Robert H. Eklund et al., Ser. No. 595,505, filed Oct. 11, 1990, and "Self-Aligned Bipolar Transistor Structure and Fabrication Process", by Robert H. Eklund, Ser. No. 07/583,422 filed Sept. 17, 1990, both assigned to Texas Instruments.

BACKGROUND OF THE INVENTION

This invention is in the field of integrated circuits, and is specifically directed to the process of forming a bipolar transistor structure that is compatible with the formation of CMOS structures on a single semiconductor substrate.

The integration of MOSFET structures and bipolar transistors on a single substrate has become very desirable. In addition, silicon on insulator (SOI) technology offers the highest performance for a given feature size due to the minimization of parasitic capacitance.

As is well known in the art, digital and linear functions are often performed by integrated circuits using either bipolar or metal-oxide-semiconductor (MOS) technology. Bipolar integrated circuits, of course, provide higher speed operation and greater drive currents than the MOS circuits, at the cost of higher power dissipation, especially when compared against complementary MOS (CMOS) circuits. Recent advances in manufacturing technology have allowed the use of both bipolar and CMOS transistors in the same integrated circuit (commonly referred to as BiCMOS devices). Further exploitation of the high current driving capabilities of the bipolar transistor is important to obtaining even higher levels of bipolar or merged bipolar CMOS integration.

To date, SOI processes have been CMOS oriented. For bipolar or BICMOS processes in SOI, typical problems have been the defect density caused by the buried oxide layer. Various approaches to SOI bipolar structures have been demonstrated but these approaches suffer from the limitation that they require trench isolation which, in addition to being an expensive process, trench isolation tends to be a yield limiting process in manufacturing.

SUMMARY OF THE INVENTION

The invention provides a bipolar transistor structure on a buried oxide layer for use in an integrated circuit and a method for fabricating the same. The invention may be incorporated into a method for fabricating bipolar transistors in a BiCMOS structure.

The bipolar transistor is constructed in two stacked epitaxial layers. The first epitaxial layer is used to form both the MOSFET and the buried collector of the bipolar transistor. The second epitaxial layer is grown as a blanket epitaxial layer. The collector and the base of the bipolar transistor are formed in the second epitaxial layer. An oxide layer is formed over the base. The emitter is formed of a polysilicon layer which is deposited through an opening in the oxide layer such that the polysilicon layer contacts the second epitaxial layer.

This is a method of fabricating a bipolar transistor and a CMOS transistor on an SOI substrate, the method comprises: forming a first epitaxial layer on the surface of the SOI substrate, the epitaxial layer having a bipolar transistor region and a CMOS transistor region; forming a resist patterned in the inverse of the buried collector over the first epitaxial layer; forming a buried collector in the bipolar region of the first epitaxial layer; growing a blanket second epitaxial layer over the first epitaxial layer; forming an oxide layer over the second epitaxial layer; forming an emitter opening in the oxide layer; depositing a polysilicon layer; and patterning an emitter contact in the polysilicon layer on the opening in the oxide layer and overlapping the oxide layer, whereby the oxide layer over the second epitaxial layer serves as an etch stop for the emitter etch, and whereby the process can use standard SOI CMOS and bulk BICMOS processes and has the advantage of eliminating the isolation problems encountered in a bulk BICMOS process, and whereby the buried n+ collector reduces the collector resistance.

Preferably, the method utilizes forming a thick oxide layer at one portion of the second epitaxial layer and a deep collector contact at a second portion of the second epitaxial layer the thick oxide layer being between the emitter opening and the deep collector contact, and also utilizes the emitter contact partially overlaying the thick oxide and further the emitter polysilicon overlaps the oxide layer, whereby the oxide serves as an insulator between the emitter poly and the base, and also as an etch stop for the emitter etch. Preferably, a moat pattern is formed and a silicon etch is performed to isolate device regions, and also the silicon etch to isolate device regions is performed after the second epitaxial growth. Also preferably a CMOS transistor is formed in the CMOS transistor region, and wherein the forming an oxide layer over the second epitaxial layer also forms an oxide layer on the CMOS region and wherein the patterning of the polysilicon layer also patterns a poly gate.

The invention is also a bipolar transistor and a CMOS transistor on an oxygen implanted silicon substrate, with the transistors comprising: a buried oxide substrate; an CMOS epitaxial mesa; a stepped epitaxial bipolar mesa on the substrate, the stepped epitaxial bipolar mesa having a lower buried collector portion at essentially the same height as the CMOS mesa and also having an upper portion; a poly gate on the CMOS mesa; a poly emitter contact on the bipolar mesa upper portion; and a thick oxide layer at one portion of the second epitaxial layer and a deep collector contact at a second portion of the second epitaxial layer the thick oxide layer being between the emitter opening and the deep collector contact. Preferably, the emitter polysilicon partially overlays the thick oxide.

DETAILED DESCRIPTION OF THE INVENTION

A preferred embodiment of the present invention is described herein as incorporated into a BiCMOS structure. BiCMOS processes can be integrated into a CMOS/SOI process flow. It should of course be understood that the bipolar transistor according to the invention may be incorporated into integrated circuits which are constructed as bipolar structures. An example of SOI is described in Houston, et al. U.S. Pat. No. 4,863,878 issued Sept. 5, 1989.

This invention uses an SOI process which is suitable for fabricating either bipolar or BICMOS circuits without requiring that trench isolation be used. The use of a buried collector in a BiCMOS/SOI process without using trench isolation has apparently never been done before. In addition, this process could be used to fabricate fully isolated NPN and PNP bipolar transistors and resistors. The process requires a second epitaxial layer for the bipolar transistor with the rest of the process being a combination of standard SOI CMOS and bulk BICMOS processes.

Figure 1:
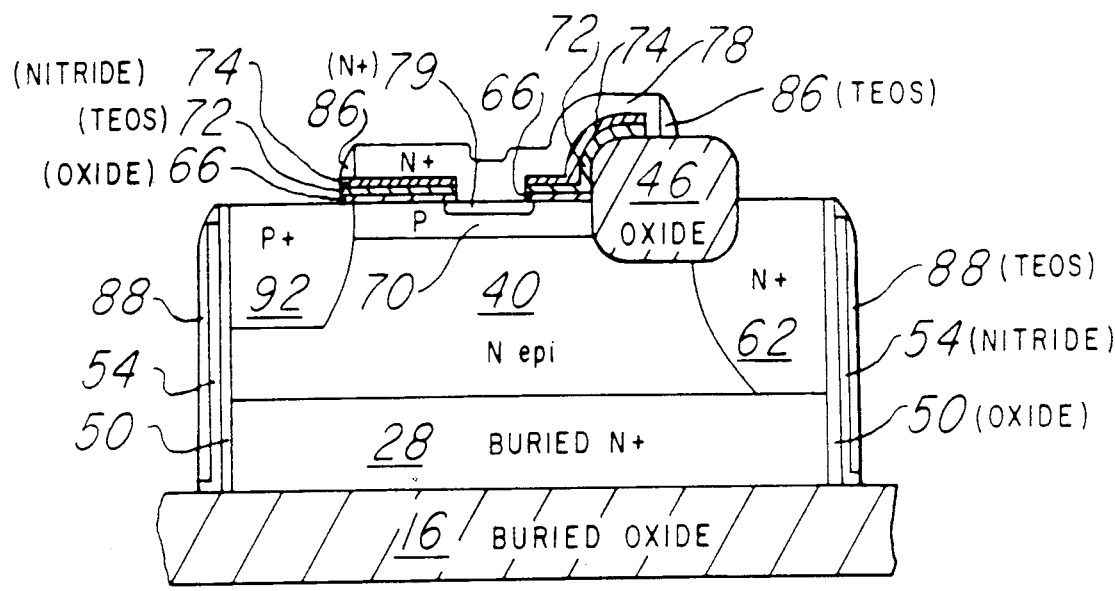
FIG. 1 is a cross-sectional view showing a preferred embodiment of the present invention wherein a bipolar transistor is constructed in two epitaxial layers on top of a buried oxide layer.

FIGS. 1 through 11 are cross sectional diagrams showing a preferred embodiment of the present invention and method for forming the same. FIG. 1 is a cross-sectional view of the bipolar transistor. The buried N+28 which forms the bipolar buried collector is formed in the same epitaxial layer as the MOSFET. The circuit contains buried oxide layer 16, buried n+ epitaxial layer 28, n-type layer 40 formed in second epitaxial layer, bipolar field oxide 46, oxide sidewall 50, nitride sidewall 54, deep n+ collector contact 62, oxide layer 66, p-type base region 70, TEOS layer 72, nitride layer 74, emitter polysilicon 78, emitter 79, TEOS sidewalls 86 and 88, and p+extrinsic base 92.

A technical advantage is provided by the buried n+ collector 28 by reducing the collector resistance. The resistance is reduced because the n-type collector 42 is connected to the relatively large area of the buried n+ layer 28 whereas if the buried n+ layer were not used, the n-type collector would only be connected to an n+ region on the side of the collector such as the deep n+ region 54. A further technical advantage is the ability to locate the deep n+ collector contact further from the emitter by using a thick oxide 46 without significantly increasing the collector resistance. This lowers the capacitance between collector contact and base.

Figure 2:
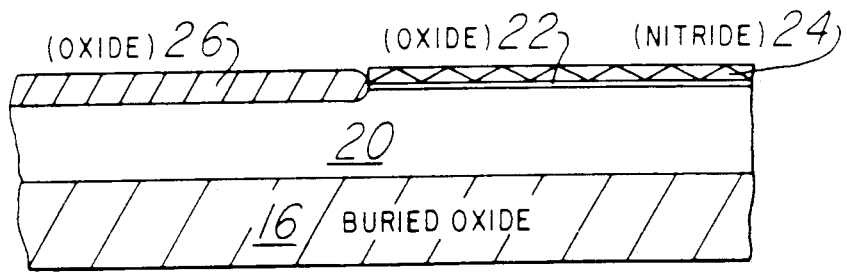
FIGS. 2 through 11 are cross-sectional views showing the processing steps of a preferred embodiment of the present invention wherein a bipolar transistor is constructed in two epitaxial layers on top of a buried oxide layer, and an NMOS transistor is constructed in a single epitaxial layer on top of the same buried oxide layer.
Figure 3:
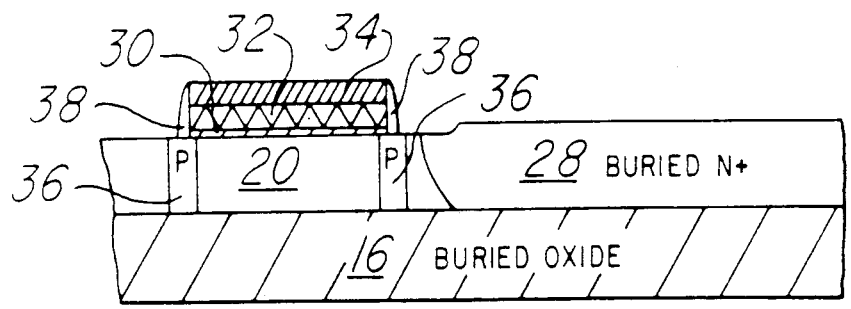
Figure 4:
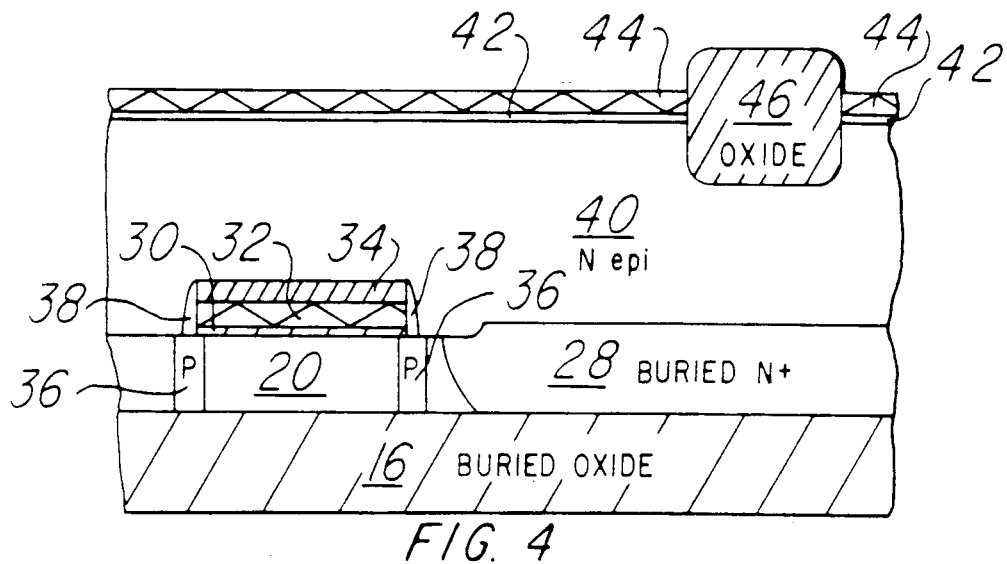

FIGS. 2 through 11 are cross sectional drawings showing a process flow for integrating a preferred embodiment of the present invention into a CMOS/SIMOX (separation by implanted oxygen) process flow. The process begins with SIMOX starting material (buried oxide) 16. Then a 0.6 to 0.8 um epitaxial layer 20 is formed on the surface of the buried oxide 16. After growing a 350 angstrom pad oxide 22 and depositing a 1,000 angstrom nitride layer 24, the inverse of the bipolar collector region is patterned and the nitride is etched. An oxide 26, shown in FIG. 2, is grown to reduce the epitaxial thickness to approximately 0.33 um as required by the CMOS transistor design. After stripping the nitride 24 and deglazing the pad oxide 22, the buried n+ region 28 is implanted with ions such as antimony or arsenic followed by a diffusion annealed. The oxide 26 is removed by a wet deglaze. Next, a 350 angstrom pad oxide 30 is grown, followed by a 1,400 angstrom nitride 32 and 3,200 angstrom TEOS deposition 34. The CMOS mesa 19 is then patterned and the oxide/nitride/TEOS stack is etched. After patterning and implanting ions such as boron (e.g. 0 degrees 1.8E13 cm-2 at 30 KeV and 3.0E13 cm-2 at 80 KeV) to form the NMOS channel stops 36, a 1,000 angstrom TEOS film is deposited, densified (e.g. 700 degrees C. for 30 minutes), and plasma etched to form a sidewall oxide spacer 38 on the mesa stack, as shown in FIG. 3. Note that TEOS layer 34 might be gone after the plasma etch to form sidewall oxide spacer 38.

The second epitaxial layer 40 is then grown as a blanket epitaxial layer instead of selective as has been proposed in copending application Ser. No. 595,505, filed Oct. 11, 1990. Over the MOS region 19, poly will grow due to the mesa mask, but with a bipolar to MOS mesa spacing of greater then 2 microns, the epitaxial layer over the bipolar region 17 will be single crystal. While the epitaxial layer 40 could be grown as intrinsic and implant doped, it is grown n-type in this embodiment. The epitaxial deposition temperature is kept low in order to minimize the diffusion of the NMOS channel stop 36. Next, a 350 angstrom pad oxide 42 is grown, followed by a 1,400 angstrom nitride 44. Then the oxide/nitride layer is patterned and etched, and a 7000 angstrom bipolar field oxide 46 is grown. The bipolar field oxide 46 is grown in a high pressure mode to minimize the thermal cycle. This bipolar field oxide 46 serves as a self aligning mask for the deep n+ collector contact 62. While the bipolar field oxide 46 is only shown between the base and deep n+ regions, it could surround the base and deep n+ moats if necessary.

Figure 5:
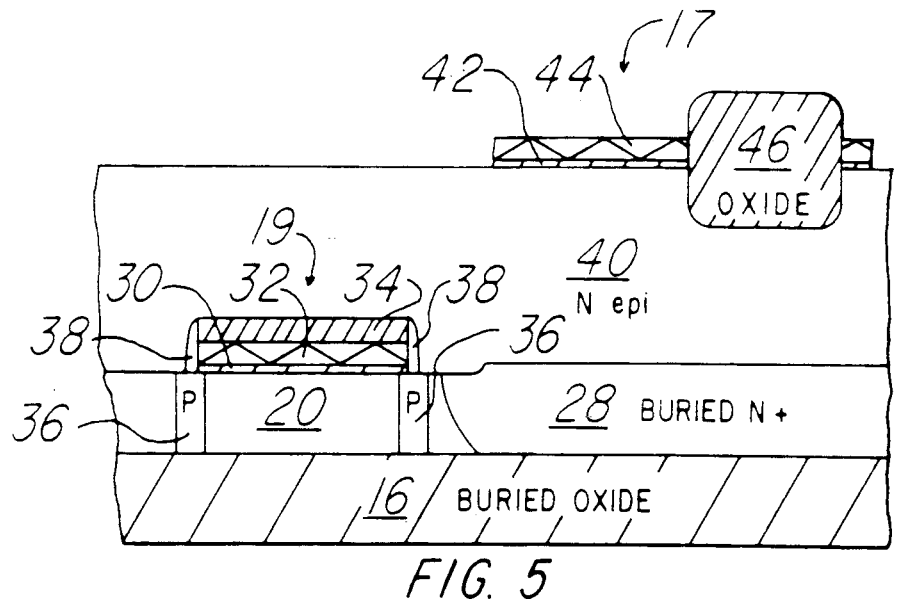
Figure 6:
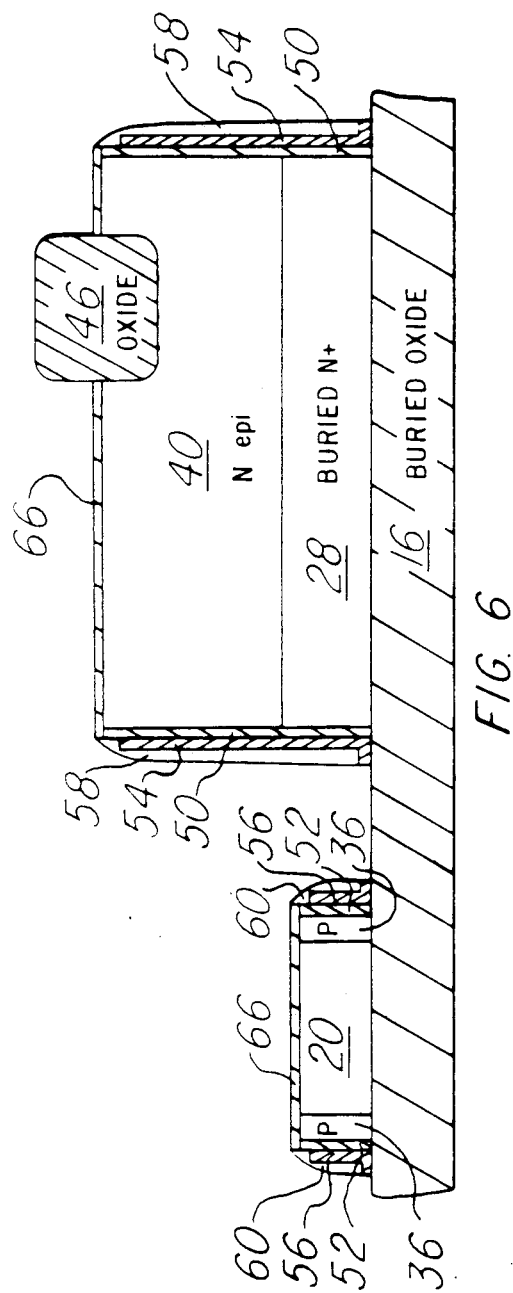
Figure 7:
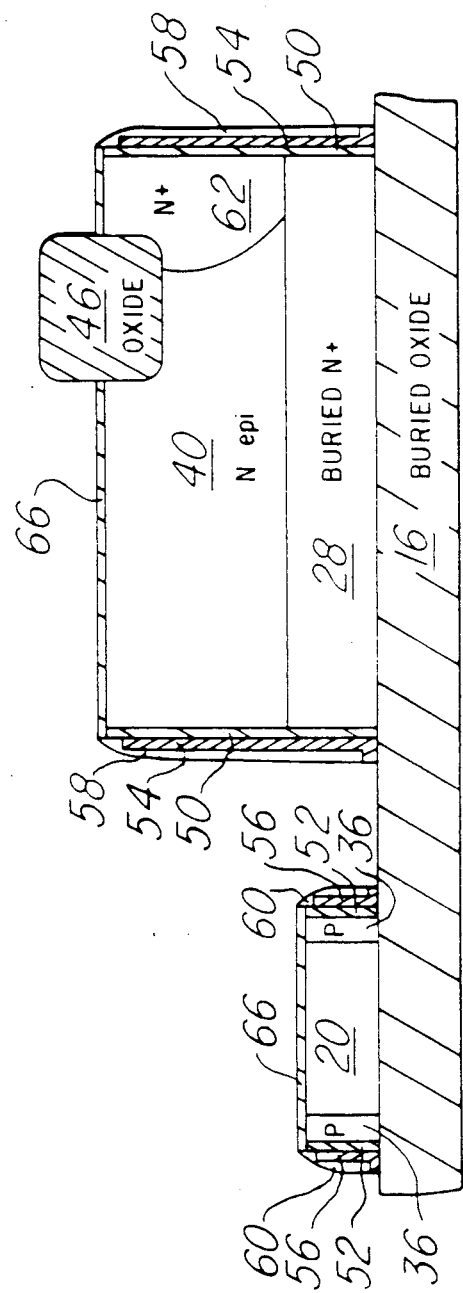

The bipolar transistor region is then patterned and the oxide/nitride layer is etched from the region above the CMOS region to leave the structure shown in FIG. 5. At this point, the silicon etch to form the mesas is performed. After the silicon etch, a 200 angstrom oxidation 50 is grown on the mesa sidewalls. After a nitride strip, the sidewall formation is completed by means of a 150 angstrom nitride 54 and 56 deposition followed by a 1,000 angstrom TEOS deposition and plasma etch to form the sidewall 58 and 60 (FIG. 6). The deep n+ collector contact 62 is patterned and implanted with ions such as phosphorus (e.g. 1.0E16 cm-2 at 150 KeV), and is self aligned to the bipolar field oxide 46. The NMOS and PMOS threshold voltage, and tank implants are then patterned and implanted with ions such as boron (e.g. 1.7E12 cm-2 at 25 KeV and 3.5E12 cm-2 at 80 KeV) for the NMOS threshold voltage and tank, and boron (e.g. 1.0E12 cm-2 at 24 KeV) and phosphorus (e.g. 2.7E12 cm-2 at 180 KeV) for the PMOS threshold voltage and tank.

Figure 8:
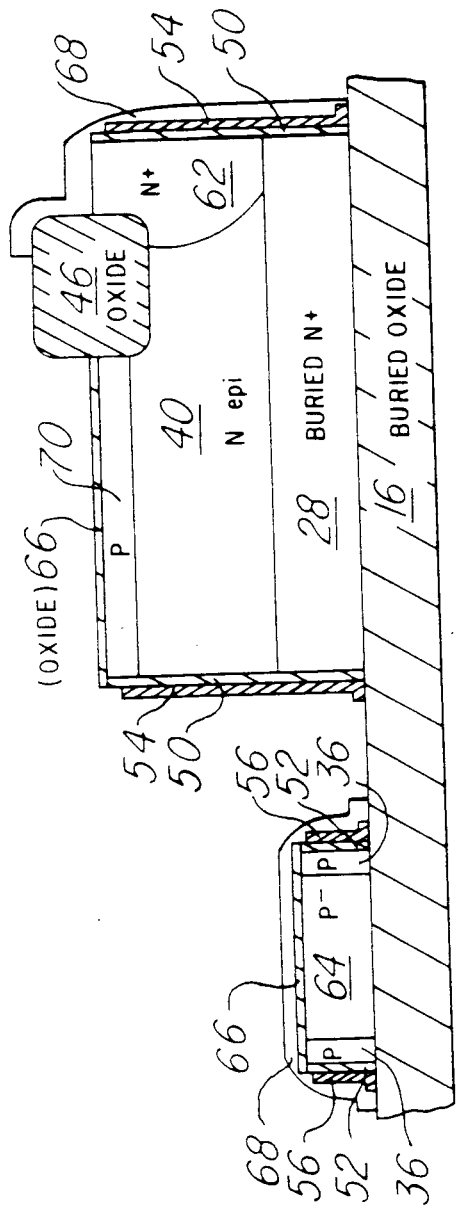
Figure 9:
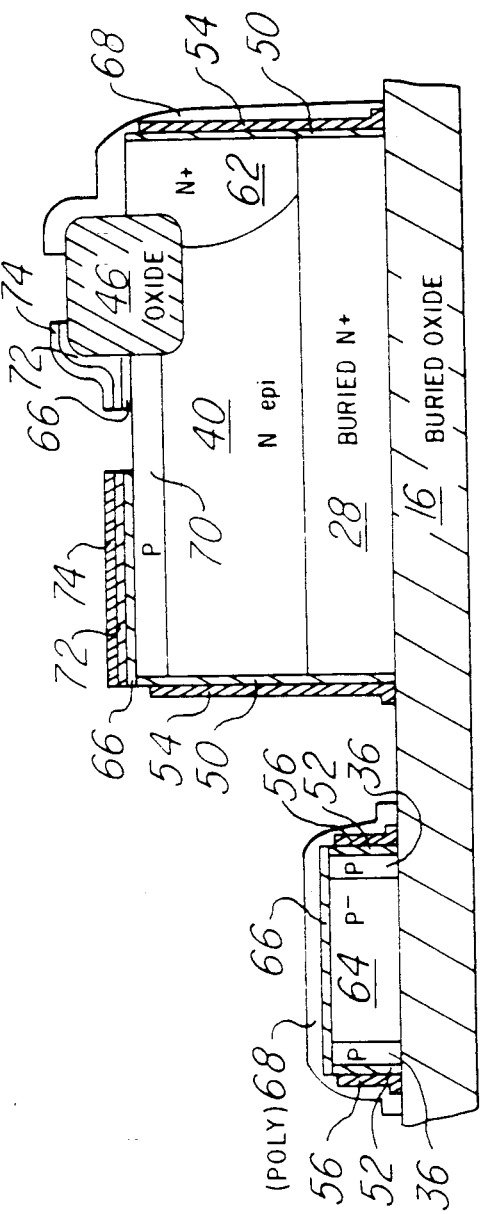

After deglazing the dummy oxide from the mesa surface, a 200 angstrom gate oxide 66 is grown, followed by a 2,000 angstrom polysilicon deposition 68. It should be mentioned that a split polysilicon process is being used so that the MOS gate oxide can be protected while the bipolar base 70 and emitter window 76 are being formed. The base 70 is formed following gate oxidation to limit its junction depth. The bipolar base region 70 is patterned and the polysilicon is removed from this region by a plasma etch (FIG. 8). The p-type base 70 is then formed by implanting ions such as boron. Next, a 600 angstrom TEOS layer 72 is deposited, followed by a 200 angstrom nitride layer 74. The TEOS layer 72 and nitride layer 74 are used to increase dielectric thickness between emitter poly and base. This increase in dielectric could also be formed by a TEOS layer only or a nitride layer only. The emitter contact is patterned so that it opens the emitter window 76 and all CMOS regions but leaves the TEOS/nitride stack 72 and 74 over the rest of the bipolar base region (although not shown on the figures, these layers can be masked to slightly overlap the extrinsic base side of the mesa to make alignment less critical). The first 2,000 angstrom polysilicon film 68 protects the CMOS mesa during the emitter etch. This process has been used for bulk BiCMOS without any GOI (gate oxide integrity) degradation problems. FIG. 9 shows the cross section after the emitter etch.

Figure 10:
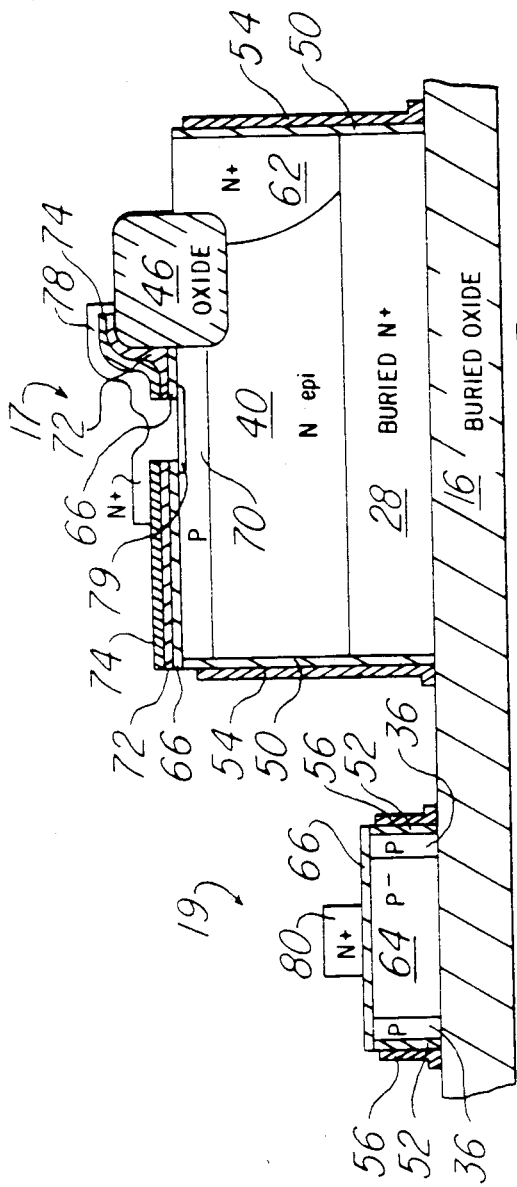

Next, after a short deglaze, a 2,500 angstrom polysilicon layer is deposited and doped by implantation of ions such as arsenic (e.g. 5E15 cm-2 at 50 KeV and 5E15 cm-2 at 150 KeV) and phosphorus (may be optional) (e.g. 2E15 cm-2 at 80 KeV). This polysilicon layer serves as the bipolar emitter 78 and, in combination with the first polysilicon layer, forms a 4,500 angstrom polysilicon gate 80. Next, the gates and emitters are patterned and the polysilicon is etched, as shown in FIG. 10. After patterning and implanting both p (e.g. boron, 1.0E13 cm-2 at 20 KeV, 0 degrees) and n (e.g. phosphorus, 8.0E13 cm-2 at 80 KeV, 0 degrees) LDDs (lightly doped drains), a 2,500 angstrom TEOS layer is deposited and etched back to form sidewall oxide spacers 84, 86, 88, and 90. Then a 300 angstrom TEOS screen oxide (not shown) is deposited. Next, the p+ (not shown) and n+ 94 source/drain (S/D) regions are patterned and implanted. For the p+ S/D regions, ions such as boron (e.g. 3.0E15 cm-2 at 20 KeV, 0 degrees) are implanted. For the n+ S/D regions 94, ions such as arsenic (e.g. 3.0E15 cm-2 at 150 KeV, 0 degrees) and phosphorus (e.g. 5.0E14 cm-2 at 120 KeV, 0 degrees) are implanted The p+ S/D implant also forms the extrinsic base 92. Next, an S/D anneal is performed at 900 degrees C. for 25 minutes. The S/D anneal also serves as the emitter anneal. The TEOS is then plasma etched to leave the TEOS sidewalls 84, 86, 88, and 90.

Figure 11:
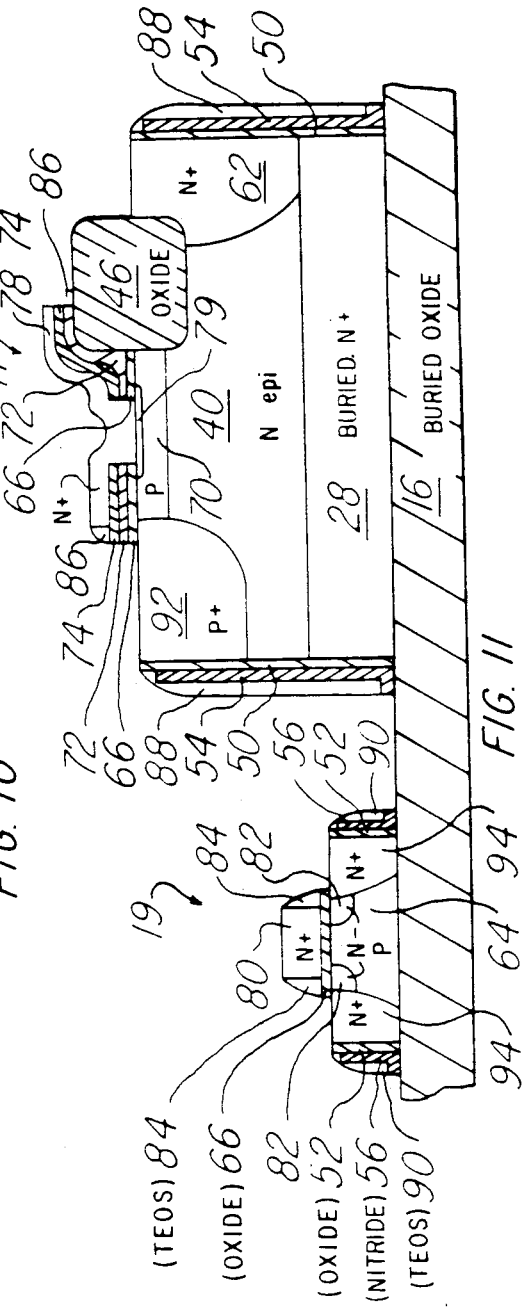

FIG. 11 shows the cross section after the S/D anneal cycle has been completed and the screen oxide has been etched. Titanium disilicide is then used to simultaneously clad all diffusions and gates. Standard multi-level metal processing completes the process flow.

Although a specific embodiment of the present invention is herein described, it is not to be construed as limiting the scope of the present invention. For example, the NPN bipolar transistor shown in the preferred embodiment could be built as a PNP bipolar transistor by switching the dopants around. The PNP would contain a buried p+ layer, n-type base, p-type epitaxial layer, and p+ emitter. The emitter implant would have to be patterned. Also, the preferred embodiment is described for a BiCMOS/SOI process, but the invention could be used for a bipolar/SOI process also. Many embodiments of the present invention will become clear to those skilled in the art in light of the teachings of the specification. The scope of the invention is limited only by the claims appended.

I claim:

1. A method of fabricating a bipolar transistor and a CMOS transistor on an SOI substrate, said method comprising:
   a forming a first epitaxial layer on the surface of the SOI substrate, said epitaxial layer having a bipolar transistor region and a CMOS transistor region;
   b forming a resist patterned in the inverse of the buried collector over said first epitaxial layer;
   c forming a buried collector in said bipolar region of said first epitaxial layer;
   d growing a blanket second epitaxial layer over the first epitaxial layer;
   e forming an oxide layer over said second epitaxial layer;
   f forming an emitter opening in the oxide layer;
   g depositing a polysilicon layer; and
   h patterning an emitter contact in said polysilicon layer on said opening in the oxide layer and overlapping said oxide layer, whereby the oxide layer over said second epitaxial layer serves as an etch stop for the emitter etch, and whereby the process can use standard SOI CMOS and bulk BICMOS processes and has the advantage of eliminating the isolation problems encountered in a bulk BICMOS process, and whereby the buried n+ collector reduces the collector resistance.

2. The method of claim 1, wherein said method utilizes forming a thick oxide layer at one portion of said second epitaxial layer and a deep collector contact at a second portion of said second epitaxial layer said thick oxide layer being between said emitter opening and said deep collector contact.

3. The method of claim 2, wherein said emitter polysilicon partially overlays said thick oxide.

4. The method of claim 1, wherein a moat pattern is formed and a silicon etch is performed to isolate device regions.

5. The method of claim 4, wherein said silicon etch to isolate device regions is performed after said second epitaxial growth.

6. The method of claim 1, wherein a CMOS transistor is formed in said CMOS transistor region, and wherein said forming an oxide layer over said second epitaxial layer also forms an oxide layer on said CMOS region and wherein said patterning of said polysilicon layer also patterns a poly gate.

7. The method of claim 1, wherein said emitter contact overlaps said oxide layer, whereby said oxide serves as an insulator between the emitter poly and an extrinsic base, and also as an etch stop for the emitter etch.

* * * * *